(12) United States Patent
Kito et al.

(10) Patent No.: US 7,391,068 B2
(45) Date of Patent: Jun. 24, 2008

(54) SEMICONDUCTOR DEVICE

(75) Inventors: Masaru Kito, Yokohama (JP); Ryota Katsumata, Yokohama (JP); Hideaki Aochi, Kawasaki (JP); Nobutoshi Aoki, Yokohama (JP); Masaki Kondo, Kawasaki (JP); Sanae Ito, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/442,352

(22) Filed: May 30, 2006

(65) Prior Publication Data

US 2006/0289905 A1 Dec. 28, 2006

(30) Foreign Application Priority Data

Jun. 23, 2005 (JP) ............... 2005-184076

(51) Int. Cl.
*H01L 29/00* (2006.01)
(52) U.S. Cl. ....................................... 257/288
(58) Field of Classification Search ................. 257/288
See application file for complete search history.

(56) References Cited

U.S. PATENT DOCUMENTS

| 6,853,031 | B2 * | 2/2005 | Liao et al. ................ 257/328 |
| 2002/0011612 | A1 | 1/2002 | Hieda | |
| 2005/0127424 | A1 | 6/2005 | Kito et al. | |

FOREIGN PATENT DOCUMENTS

| GB | 2256315 | 12/1992 |
| JP | 56-71974 | 6/1981 |
| JP | 2-201965 | 8/1990 |
| JP | 4-368180 | 12/1992 |
| JP | 7-78976 | 3/1995 |
| JP | 7-221304 | 8/1995 |
| JP | 8-274326 | 10/1996 |
| JP | 2000-91571 | 3/2000 |
| JP | 2002-118255 | 4/2002 |

OTHER PUBLICATIONS

U.S. Appl. No. 10/806,398, filed Mar. 23, 2004, Masaru Kito, et al.
U.S. Appl. No. 09/916,509, filed Jul. 30, 2001, Katsuhiko Hieda.
U.S. Appl. No. 11/311,268, Dec. 20, 2005, Masaru Kito et al.
Chul-Sung Kim, et al., "Performance of DRAM Cell Transistor with Thermal Desorption Silicon Etching (TDSE) and Selective Si Channel Epi Techniques", Jpn. J. Appl. Phys. vol. 42, Apr. 2003, pp. 1865-1869.
U.S. Appl. No. 11/442,352, filed May 30, 2006, Kito et al.
U.S. Appl. No. 11/765,881, filed Jun. 20, 2007, Kito et al.

* cited by examiner

*Primary Examiner*—Jerome Jackson
*Assistant Examiner*—Anthony Ho
(74) *Attorney, Agent, or Firm*—Oblon, Spivak, McClelland, Maier & Neustadt, P.C.

(57) ABSTRACT

A semiconductor device comprising at least one FET formed on the semiconductor substrate, wherein the FET comprises a source region, a drain region, a channel region formed between the source and drain regions and including a plurality of projected epitaxial silicon regions arranged in a width direction of the channel region, each of the projected epitaxial silicon regions having a triangular ridge portion, a gate insulating film formed on the channel region, and a gate electrode formed on the gate insulating film.

8 Claims, 18 Drawing Sheets

Junction depth a=b
(b is slightly smaller)

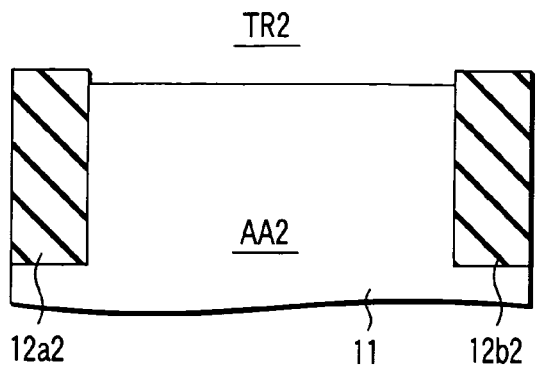
F I G. 21
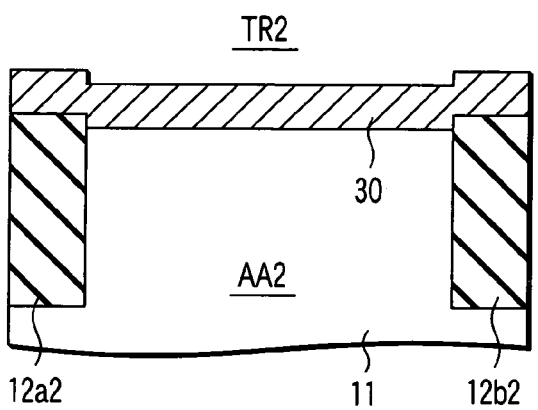
F I G. 22
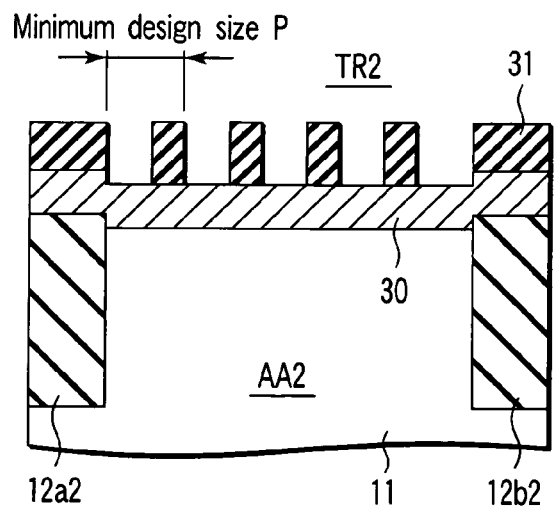
F I G. 23

SEMICONDUCTOR DEVICE

CROSS-REFERENCE TO RELATED APPLICATIONS

This application is based upon and claims the benefit of priority from prior Japanese Patent Application No. 2005-184076, filed Jun. 23, 2005, the entire contents of which are incorporated herein by reference.

BACKGROUND OF THE INVENTION

1. Field of the Invention

The present invention relates to a semiconductor device, and more particularly to a field effect type transistor.

2. Description of the Related Art

Miniaturization of a semiconductor integrated circuit that incorporates field effect type transistors (FETs) has been accompanied by a need to miniaturize such FETS. However, such miniaturization brings about a reduction in a driving force, i.e., drain current, which in turn leads to a reduction in operation speed of a semiconductor device. Thus, there is an urgent need to achieve miniaturization while maintaining driving force.

As means for increasing the driving force of the transistor, there are available methods of achieving low resistance by metal-saliciding a source/drain section, using an extremely shallow and high-concentration diffusion layer, and the like. These methods are designed to improve performance when a planar (two-dimensional) device structure is maintained.

Additionally, there has been invented a method of increasing a driving force by employing a three-dimensional structure of a channel region such as a fin-type FET to increase a physical channel width. In the case of the fin-type FET, however, a fin width must be reduced to improve cut-off characteristics of the transistor, and accordingly the fin width must be smaller than a minimum design rule size. Thus, an additional process having high technical hurdles is necessary for manufacturing.

Jpn. Pat. Appln. KOKAI Publication No. 2002-118255 shows an example of a three-dimensional structure of a channel region. For example, in a paragraph (0110) of this Patent Application Document, a MOS-type transistor is described with reference to FIGS. 16A to 16C of this prior art document. That is, it is described that fences 13 are arranged in parallel on a substrate, a contact with a source/drain region 17 is made common, and a gate electrode 16 is also made common, thereby achieving a large channel width of the three dimensional structure.

Further, U.S. Pat. No. 6,853,031 B2 describes a structure of a trapezoid-triple-gate FET including a plurality of trapezoid pillars juxtaposed on a semiconductor substrate. Each trapezoid pillar has a source, a channel region and a drain so as to increase a channel width for increasing the channel conductance.

However, there is a demand for a field effect type transistor (FET) which can obtain a driving force much larger than that of the MOS-type transistor described in the prior art, or achieve miniaturization. Further, there is a demand for a field effect transistor having an improved cut-off characteristic.

BRIEF SUMMARY OF THE INVENTION

According to one aspect of the present invention, there is provided a semiconductor device comprising:

a semiconductor substrate; and at least one FET formed on the semiconductor substrate;

wherein the FET comprises;

a source region formed in the semiconductor substrate;

a drain region formed in the semiconductor substrate to face the source region;

a channel region formed on the semiconductor substrate between the source and drain regions, the channel region including a plurality of projected epitaxial silicon regions arranged in a width direction of the channel region, each of the projected epitaxial silicon regions having a triangular ridge portion arranged in a direction perpendicular to the width of the channel region;

a gate insulating film formed on the channel region; and a gate electrode formed on the gate insulating film.

According to another aspect of the present invention, there is provided a semiconductor device comprising a semiconductor substrate;

a first FET formed on a first active area of the semiconductor substrate; and a second FET formed on a second active area of the semiconductor substrate;

wherein the first FET comprises:

a first source region formed in the semiconductor substrate;

a first drain region formed in the semiconductor substrate to face the source region;

a first channel region formed on the semiconductor substrate between the first source and drain regions, the first channel region including a plurality of first projected epitaxial silicon regions arranged in a width direction of the first channel region;

a first gate insulating film formed on the first channel region; and a first gate electrode formed on the first gate insulating film; and the second FET comprises:

a second source region formed in the semiconductor substrate;

a second drain region formed in the semiconductor substrate to face the second source region;

a second channel region formed on the semiconductor substrate between the second source and drain regions, the second channel region including a plurality of projected epitaxial silicon regions formed as a plurality of juxtaposed triangular ridge portions arranged in the width direction of the second channel region;

a second gate insulating film formed on the triangular ridge portions; and a second gate electrode formed on the second gate insulating film.

According to further aspect of the present invention there is provided a method of manufacturing a semiconductor device on a semiconductor substrate, the method comprising:

forming a source region of an FET in the semiconductor substrate;

forming a drain region in the semiconductor substrate to face the source region;

forming a channel region in the semiconductor substrate between the source and drain regions, the channel region including a plurality of juxtaposed triangular ridge portions arranged in a width direction of the channel region;

forming a gate insulating film on the triangular ridge portions; and forming a gate electrode on the gate insulating film.

BRIEF DESCRIPTION OF THE SEVERAL VIEWS OF THE DRAWINGS

FIG. 21 is a sectional diagram of a manufacturing process of an FET on a silicon wafer according to a seventh embodiment of the present invention;

FIG. 22 is a sectional diagram of a process subsequent to the manufacturing process of FIG. 21 on the silicon wafer;

FIG. 23 is a sectional diagram of a process subsequent to the manufacturing process of FIG. 22 on the silicon wafer;

DETAILED DESCRIPTION OF THE INVENTION

The embodiments of the present invention will be described in detail below with reference to the accompanying drawings.

First Embodiment

Figure 1A:
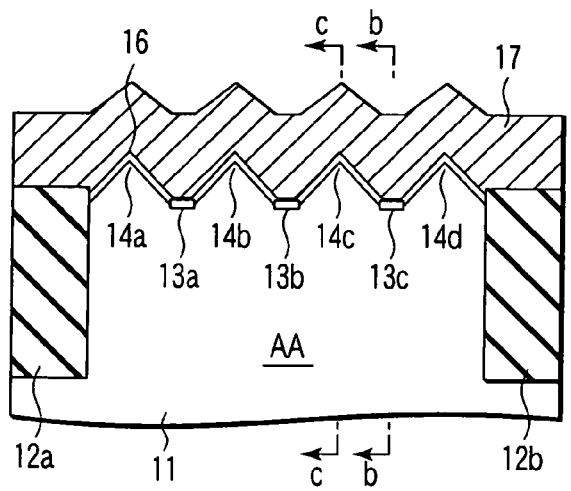
FIGS. 1A to 1D are sectional diagrams illustrating a structure of an FET according to a first embodiment of the present invention.
Figure 1B:
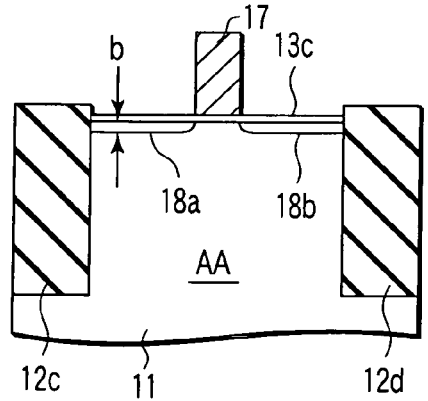
Figure 1C:
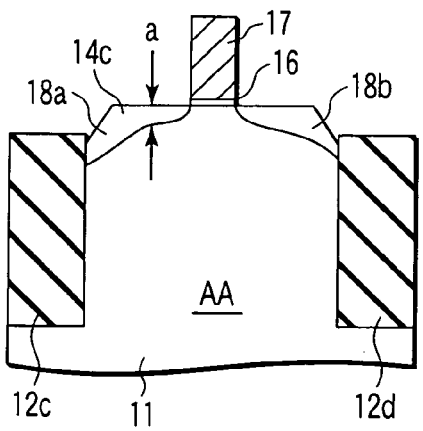
Figure 1D:
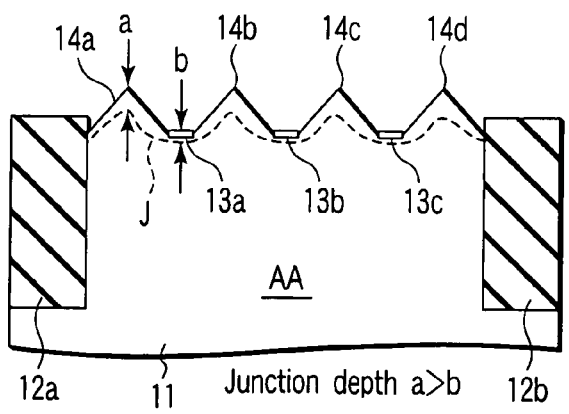

FIGS. 1A to 1D are sectional diagrams in the middle of a manufacturing process of a field effect transistor (herein referred to as FET) according to a first embodiment of the present invention: FIG. 1A is a sectional diagram showing a channel region and a gate electrode cut along a channel width direction, FIG. 1B is a sectional diagram cut along the line b-b of FIG. 1A in an arrow direction, FIG. 1C is a sectional diagram cut along the line c-c in an arrow direction, and FIG. 1D is a sectional diagram showing a profile of a junction section in a silicon wafer 11 corresponding to FIG. 1A. Hereinafter, in all the drawings designated by characters (A) to (D), the drawings designated by characters (B) to (D) (FIGS. 1B to 1D, for example) are sectional diagrams similar in relation to the drawing designated by the character (A) (FIG. 1A, for example).

Referring to FIG. 1A, a plurality (only two are shown) of element isolation regions 12a, 12b is formed in a silicon (Si) wafer 11 which is a semiconductor substrate, and an active area (AA) which is an element forming region is formed between the element isolation regions 12a, 12b. In FIG. 1A, a section of the active area AA in a channel width direction is shown. On a surface of the active area AA, three strip-shaped insulators 13a to 13c are disposed at substantially equal intervals in parallel to a direction (channel longitudinal direction) orthogonal to the channel width direction. The insulators 13a to 13c may be made of silicon oxide films (SiO2) or silicon nitride films (SiN).

An epitaxial silicon projected section 14a whose section is triangular shape is formed between the element isolation region 12a and the insulator 13a to extend in the channel longitudinal direction. Similarly, epitaxial silicon projected sections 14b to 14d of triangular shape are formed between the insulators 13a and 13b, and 13b and 13c and between the insulator 13c and the element isolation region 12b to extend in the channel longitudinal direction. Each of the triangular shaped projected sections 14a to 14d has a ridge at the top of the triangular section. Gate insulating films 16 are formed on surfaces of the epitaxial silicon projected sections 14a to 14d, and a gate electrode 17 is formed on the gate insulating films 16 to be common among the projected sections 14a to 14d.

FIG. 1B is a sectional diagram cut along the line b-b through the insulator 13c of FIG. 1A in an arrow direction. Referring to FIG. 1B, on the surface of the silicon wafer 11 directly below the gate electrode 17, the insulator 13c thicker than the gate insulating film 16 is formed between a pair of element isolation regions 12c, 12d, and source and drain regions 18a, 18b are formed to hold the gate electrode 17 therebetween in the silicon wafer 11. As this insulator 13c corresponding to a recess between the two projected sections 14c, 14d, an electric field divergence will occur at this section. Thus, transistor characteristics may be adversely affected. However, the recess is covered with the insulator 13c having a low dielectric constant and sufficiently thicker than the gate insulating film 16. Accordingly, almost no inversion layer is formed on the surface of the silicon wafer 11 therebelow. In other words, almost no channel is formed in the recess, realizing a structure of removing an adverse influence on total transistor characteristics.

FIG. 1C is a sectional diagram cut along the line c-c through a center of the epitaxial silicon projected section 14c in an arrow direction. In the drawing, the gate electrode 17 faces an upper surface of the epitaxial silicon triangular ridge of the section 14c via the gate insulating film 16. When a gate voltage is applied to the gate electrode 17, an electric field concentrates in the gate electrode 17 of this ridge section. Thus, a relatively thick depletion layer is formed at this triangularly projected portion, a current density becomes large, and responsiveness to the gate voltage is high, whereby effects such as improvement of an S factor, and a reduction in back gate effect can be obtained. According to the embodiment, four channels formed on the four projected sections 14a to 14d are connected in parallel in the channel width direction, and similarly exhibit high performance, whereby totally good characteristics are obtained for one FET. As the source and drain regions 18a, 18b are not covered with the thick insulator 13c, they are formed to relatively deep positions as shown in FIG. 1C. A junction profile J directly below the triangular projected sections 14a to 14d in a state of no gate electrode 17 has a depth from the silicon surface larger on a top ridge side (the a section) of the projected section than in a valley section (b).

A manufacturing process of the FET of the embodiment shown in FIG. 1 will be described in detail below with reference to FIGS. 2A to 6C.

Figure 2A:
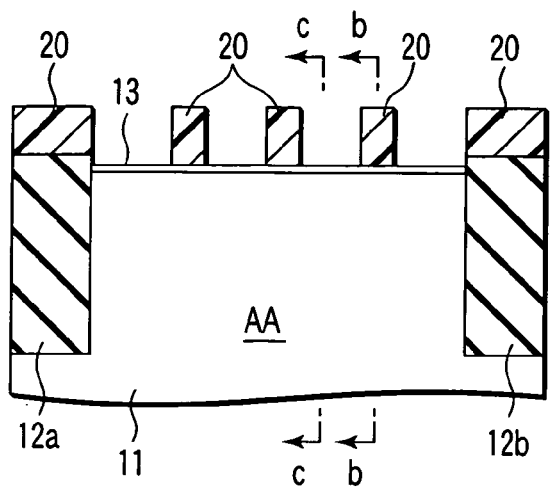
FIGS. 2A to 2C are sectional diagrams of a manufacturing process of the FET shown in FIGS. 1A to 1D on a silicon wafer.
Figure 2B:
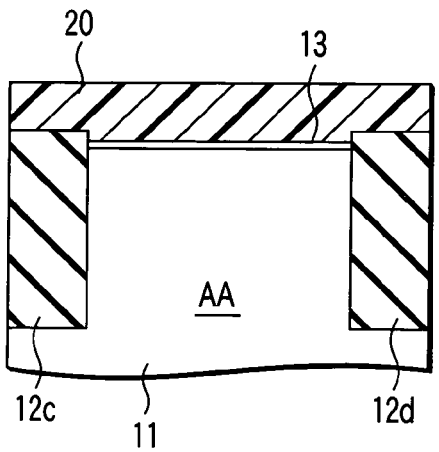
Figure 2C:
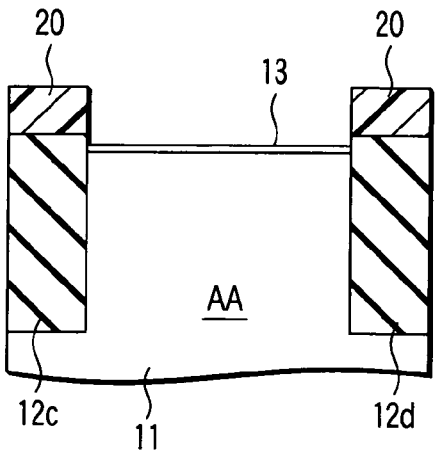

First, referring to FIGS. 2A to 2C, the channel width direction of the active area AA which is an element forming region of the silicon wafer 11 as the semiconductor substrate is defined by STI oxide films 12a, 12b which are a pair of element isolation regions formed by a generally known method as shown in FIG. 2A. In this state, on a surface of the active area AA, an insulating film of a dielectric constant lower as compared with that of a gate insulating film (described later), e.g., a silicon oxide film (SiO2) 13, is formed by thermally-oxidizing the surface of the silicon wafer 11. This silicon oxide film 13 is formed sufficiently thick as compared with a gate oxide film formed later.

Next, a resist film is deposited on a full surface of the silicon wafer 11 and, then, to form the thick strip-shaped insulators 13a to 13c shown in FIGS. 1A to 1D, desired resist masks 20 are formed by photolithography method using photo-masks and etching. In this case, for example, the resist masks 20 formed on the surface of the active area AA are formed in accordance with a line/space ratio (L/S) corresponding to a minimum design-rule size F, for example.

Figure 3A:
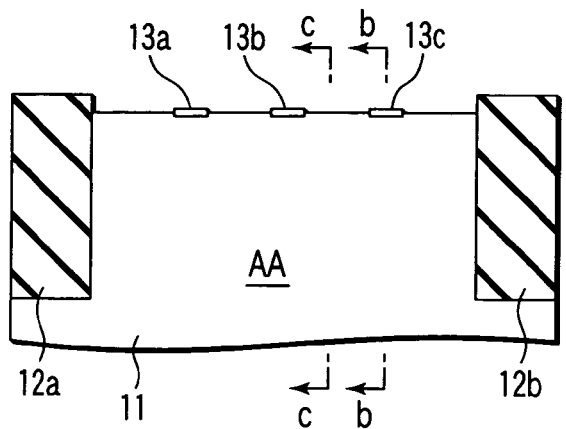
FIGS. 3A to 3C are sectional diagrams of a process subsequent to the manufacturing process of FIGS. 2A to 2C on the silicon wafer.
Figure 3B:
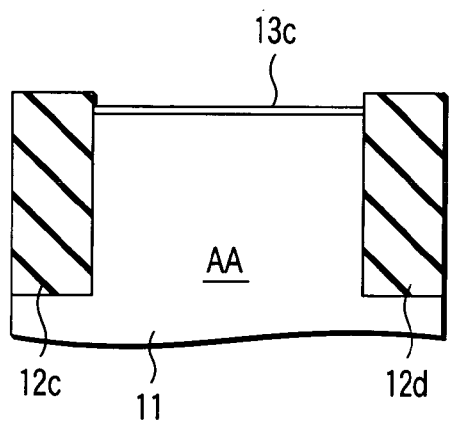
Figure 3C:
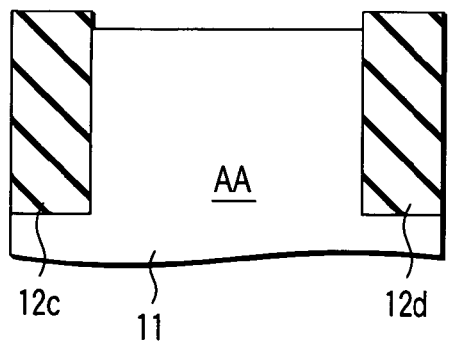

Next, to realize a structure shown in each of FIGS. 3A to 3C, the exposed oxide film 13 is etched to be removed by using the resist mask 20 as a mask in the state shown in FIGS. 2A to 2C, and then the resist mask 20 is removed. As a result, silicon insulators 13a to 13c are formed by silicon oxide films as shown in FIG. 3A.

The thick insulators 13a to 13c can be made of silicon nitride films (SiN) in place of the silicon oxide films. In this case, in place of thermally oxidizing the silicon oxide films 13 in the process of FIGS. 2A to 2C, silicon nitride films are deposited, thereby similarly forming the thick insulators 13a to 13c by the silicon insulating films.

Figure 4A:
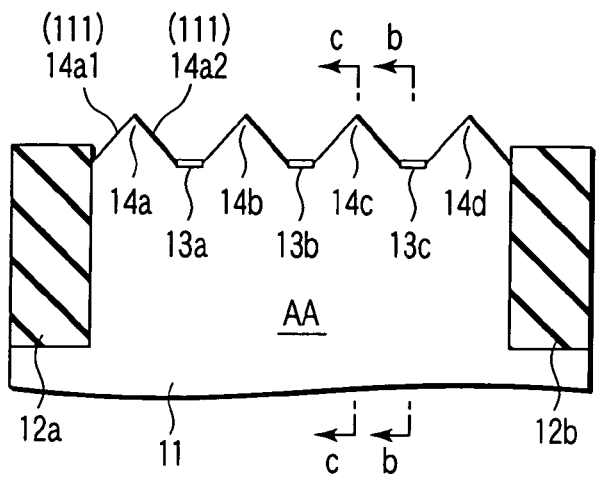
FIGS. 4A to 4C are sectional diagrams of a process subsequent to the manufacturing process of FIGS. 3A to 3C on the silicon wafer.

Subsequently, on the silicon exposed surface of the active area AA shown in FIGS. 3A to 3C, silicon is epitaxially grown by a selective epitaxial growth method (SEG method). In this case, if a silicon crystal surface on the surface of the active area AA is set to be a (100) facet, the silicon formed by the epitaxial growth grows into a triangular shape having two (111) facets inclined by predetermined angles to form a ridge between the two (111) facets. For example, as shown in FIG. 4A, an epitaxial silicon layer 14a formed between the STI oxide film 12a and the insulating film 13a becomes a triangularly projected section 14a having two slopes 14a1, 14a2 which are (111) facets and a ridge portion between the slopes. Other projected sections 14b to 14d are similarly formed.

The (111) facets constituting the slopes 14a1, 14a2 are sequentially grown with a passage of time of the epitaxial growth process, and the two slopes 14a1, 14a2 are brought into contact with each other at the end. At this time, the projected section 14a becomes a triangular shape having the ridge at the top of the triangular. The same holds true for the other projected sections 14b to 14d.

Figure 4B:
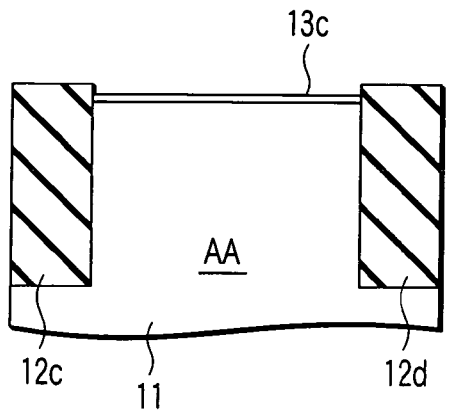
Figure 4C:
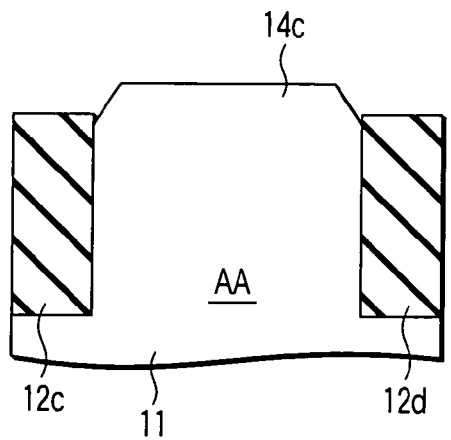

When the four silicon projected sections 14a to 14d are formed on the AA region shown in FIGS. 4A to 4C by the selective epitaxial growth method, for example, a size of a triangular shape constituting each of the projected sections 14a to 14d may be set as in the case of previous Patent Application No. 2005-1883. For example, slopes are formed such that a ridge portion of the projected section 14a of FIG. 4A has an apex angle between the two slopes 14a1, 14a2. Accordingly, the total channel width including four triangular projections can be set longer, and a driving force can be increased, whereby a punch-through suppression force and cut-off characteristics can be improved while miniaturization is realized.

For the projected sections 14a to 14d, a structure is employed in which a plurality of projected sections 14a to 14d triangular in section are included in the channel width direction as shown in FIG. 4A, while a single trapezoidal shape is provided in the channel longitudinal direction as shown in FIG. 4C. Accordingly, in the channel width direction, a substantial distance is increased by a part along the triangularly projected section as compared with its linear distance.

Subsequently, silicon oxide films are formed on the silicon surfaces of the projected sections 14a to 14d formed by the epitaxial growth by thermal oxidation, impurities are implanted into the active area AA in this state to form a well, impurities are implanted into the surface regions of the projected sections 14a to 14d to form channels, and then the implanted impurities are activated.

In this state, the silicon oxide films formed by the thermal oxidation on the surface of the epitaxial layer having the projected sections 14a to 14d formed thereon are removed by etching, gate oxide films 16 are formed again as shown in FIG. 1A, and then a polysilicon layer for a gate electrode is deposited. This polysilicon layer is patterned by lithography and etching using a predetermined mask, and a gate pattern mask is formed to form a gate electrode 17 of a shape shown in FIGS. 1A to 1C. The gate pattern mask (not shown in FIGS. 1A to 1D) is formed on the gate electrode 17 by an oxide film having a shape corresponding to the gate electrode 17. In this case, the gate pattern mask of the oxide film is formed thicker than the gate oxide film 16.

In the formed state of the gate pattern mask, for example as shown in FIG. 1B, in order to form a p-type LDD diffusion layer on the n-type substrate 11, impurity implantation is carried out to form shallow impurity doped layers 18a, 18b. Subsequently, the gate pattern mask is removed to make a structure shown in FIGS. 1A to 1D.

Next, as shown in FIGS. 5A to 5D, gate side wall insulating films 19a, 19b that determine spaces for forming LDD diffusion layers (described later) on a side face of the gate electrode 17 are formed on the side wall of the gate electrode 17 by a well-known method. In this state, by using the gate side wall insulating films 19a, 19b as spaces, p-type impurity doped layers 20a, 20b that become source/drain (S/D) diffusion layers are formed by impurity implantation. As a result, portions covered with the gate side wall insulating films 19a, 19b in the shallow impurity doped layers 18a, 18b are left as LDD diffusion layers 21a, 21b as shown, and high-concentration S/D diffusion layers 20a, 20b are formed in other portions.

Figure 5A:
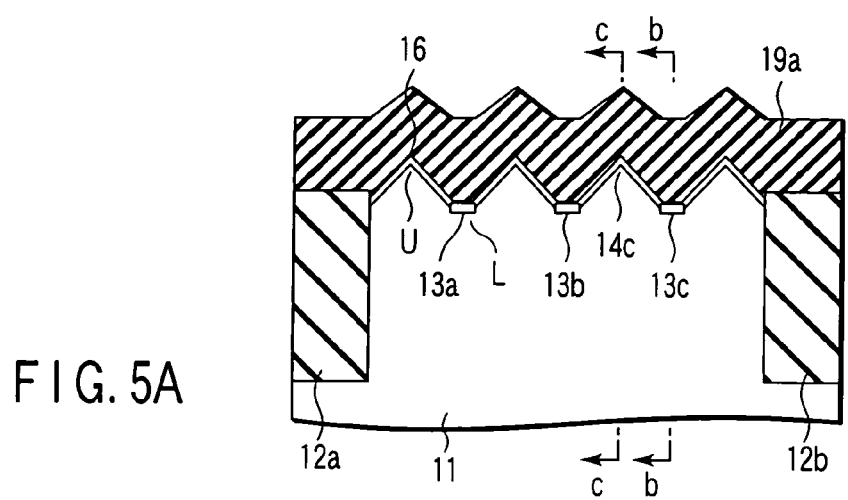
FIGS. 5A to 5D are sectional diagrams of a process subsequent to the manufacturing process of FIGS. 4A to 4C on the silicon wafer.
Figure 5B:
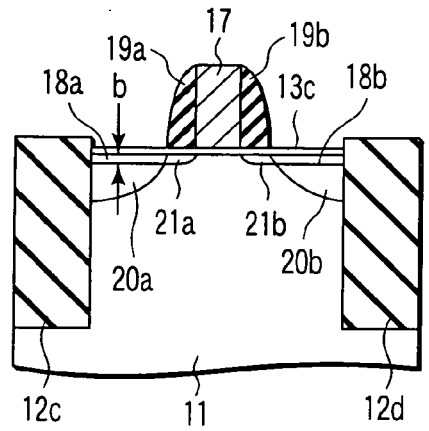
Figure 5C:
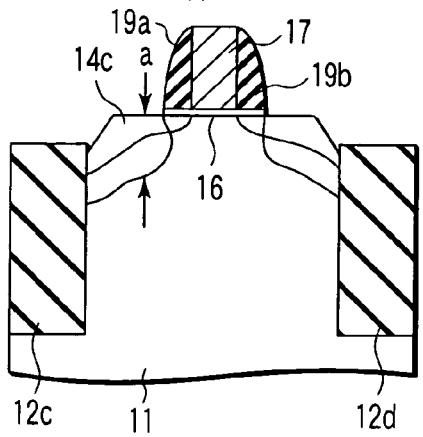
Figure 5D:
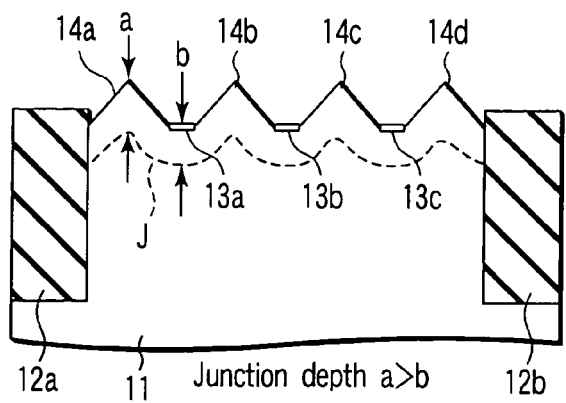

A profile of a junction J in the channel width direction in this case becomes as shown in FIG. 5D, in which a junction depth is shallower below a valley L, i.e., a trapezoid bottom side than that below a ridged top part U of each of the triangularly projected sections 14a to 14d. The shallow junction depth below the valley L is attributed to acceleration energy absorption of the impurity implantation by the thick insulators 13a to 13c.

Figure 6A:
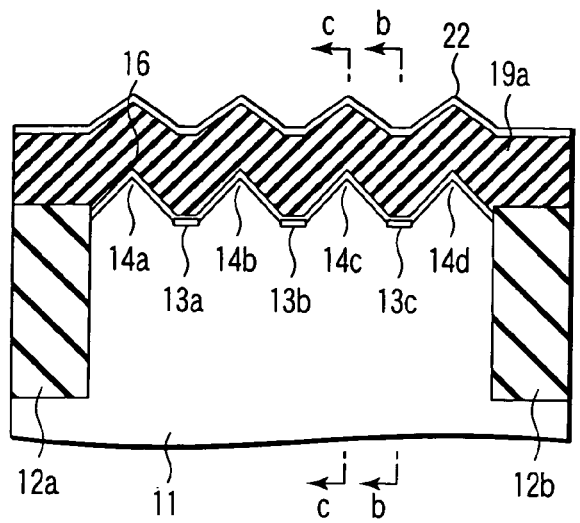
FIGS. 6A to 6C are sectional diagrams of a process subsequent to the manufacturing process of FIGS. 5A to 5D on the silicon wafer.
Figure 6B:
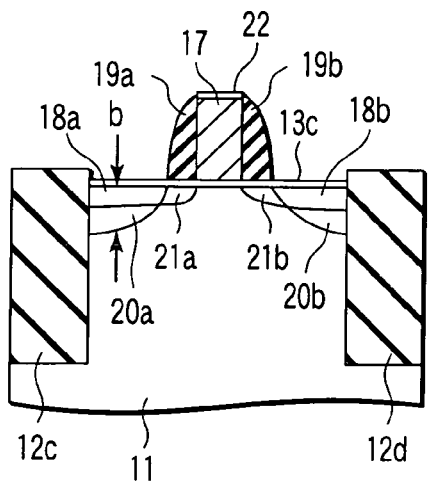
Figure 6C:
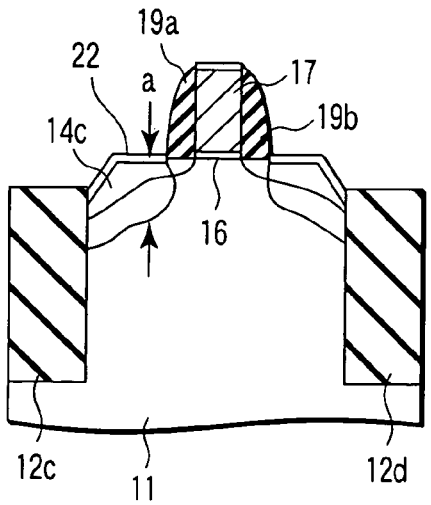

In the state shown in FIGS. 5A to 5D, as shown in FIGS. 6A to 6C, a metal salicide layer 22 is formed on the polysilicon surface of the gate electrode 17 and silicon exposed surfaces of both sides of a gate structure of the triangularly projected sections 14a to 14d. For example, the metal salicide layer 22 is formed into a structure shown in FIGS. 6A to 6C by depositing a Co film on a full surface by sputtering, saliciding the Co film by heat treatment, and then removing an unnecessary metal layer by a predetermined etching solution.

By the aforementioned method, it is possible to manufacture an FET of an optional size in which a sectional shape in the channel width direction of the channel region is sawtooth. In the FET of the first embodiment thus configured, an electric field by the gate electrode 17 becomes strong at the ridge-shaped top of each of the four triangularly projected sections 14a to 14d arranged in parallel at equal intervals in the channel width direction between the two STI regions 12a, 12b as shown in FIGS. 6A to 6C. Thus, effects such as S-factor improvement and a back gate effect reduction can be expected from an increase in current density by substantial enlargement of the channel width and enlargement of a depletion layer width by the strong electric field.

Furthermore, in the thick insulators 13a to 13c, an electric field becomes weak because a recess is formed in each thereof to diffuse the electric field of the gate electrode 17 downward toward the silicon wafer 11, causing deterioration of transistor characteristics by a reduction in current density of the channel and a reduction in the deletion layer width. According to the embodiment, however, as the thick insulators 13a to 13c are configured such that the electric field of the gate electrode 17 gives no influence to the silicon wafer 11 nearby. Thus, no channel is formed in the recess, deterioration of transistor characteristics as a whole can be prevented, and good transistor characteristics can be effectively exhibited by the projected sections.

Second Embodiment

Figure 7A:
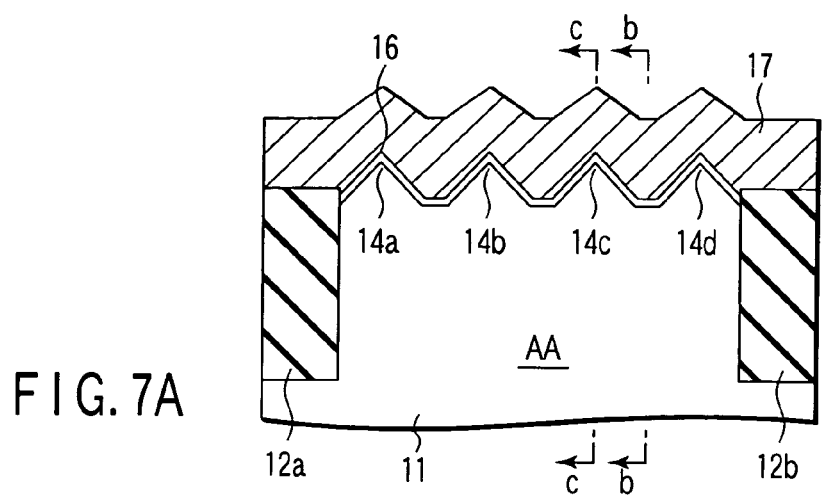
FIGS. 7A to 7D are sectional diagrams of a manufacturing process of an FET on a silicon wafer according to a second embodiment of the present invention.

FIG. 7A shows a sectional structure in the course of an FET manufacturing process according to a second embodiment of the present invention. FIG. 7A shows the sectional structure corresponding to that of FIGS. 1A to 1D of the first embodiment together with FIGS. 7B to 7D. According to the first embodiment, the thick insulating layers 13a to 13c formed in the process of FIGS. 3A to 3C are left as they are without being removed in the forming process of the gate electrode 17 of FIGS. 1A to 1D. On the other hand, according to the second embodiment, as shown in FIGS. 7A to 7D, these thick insulating layers 13a to 13c are removed immediately before the forming process of the gate electrode 17. The first and second embodiments are different from each other only on this point. As steps corresponding to those shown in FIGS. 2A to 4C are similar, description thereof will be omitted to avoid repetition. Similar portions of the first and second embodiments are denoted by similar reference numerals.

A manufacturing process of the FET of the second embodiment will be described in detail below with reference to FIGS. 7A to 9C. As in the case of the first embodiment, when the process up to FIG. 4C is completed, the thick insulating layers 13a to 13c are peeled off, exposing a surface of a silicon wafer 11 in recesses formed among triangularly projected sections 14a to 14d.

Subsequently, silicon oxide films are formed on the silicon surfaces of the triangularly projected sections 14a to 14d formed by epitaxial growth and the surface of silicon wafer 11 of the recesses by thermal oxidation, impurities are implanted into an active area AA in this state to form a well, impurities are implanted into the surface regions of the projected sections 14a to 14d and the surface of the silicon wafer 11 of the recesses to form channels, and then the implanted impurities are activated.

In this state, the silicon oxide films formed by the thermal oxidation on the surface of the epitaxial layer having the projected sections 14a to 14d formed thereon and the surface of the silicon wafer 11 of the recesses are removed by etching, gate oxide films 16 are formed again as shown in FIGS. 7A to 7D, and then a polysilicon layer for a gate electrode is deposited. This polysilicon layer is patterned by lithography and etching using a predetermined mask, and a gate pattern mask is formed to form a gate electrode 17 of a shape shown in FIGS. 7A to 7C. The gate pattern mask (not shown in FIGS. 7A to 7D) is formed on the gate electrode 17 by an oxide film having a shape corresponding to the gate electrode 17. In this case, the gate pattern mask of the oxide film is formed thicker than the gate oxide film 16.

Figure 7B:
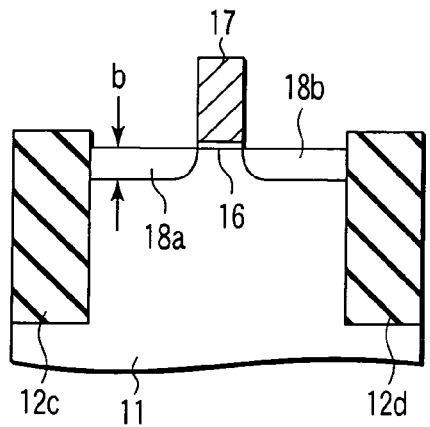
Figure 7C:
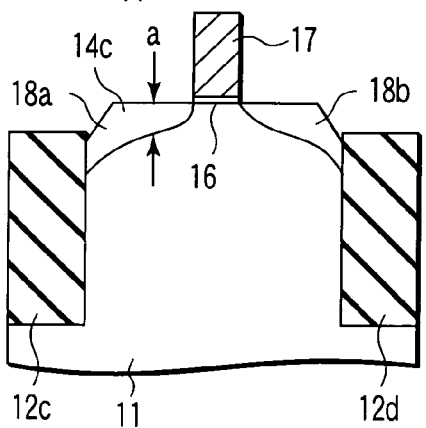

In the formed state of the gate pattern mask, for example as shown in FIG. 7B, in order to form a p-type LDD diffusion layer on the n-type substrate 11, impurity implantation is carried out to form shallow impurity doped layers 18a, 18b. Subsequently, the gate pattern mask is removed to make a structure shown in FIGS. 7A to 7D. Profiles of the impurity doped layers 18a, 18b directly below an upper part of the projected section 14c are as shown in FIG. 7C. For depths of junctions J directly below the projected sections 14a to 14d, as shown in FIG. 7D, as acceleration energy is not absorbed during the implantation, depths a, b directly below a ridge-shaped top and a valley are substantially equal to each other.

Figure 8A:
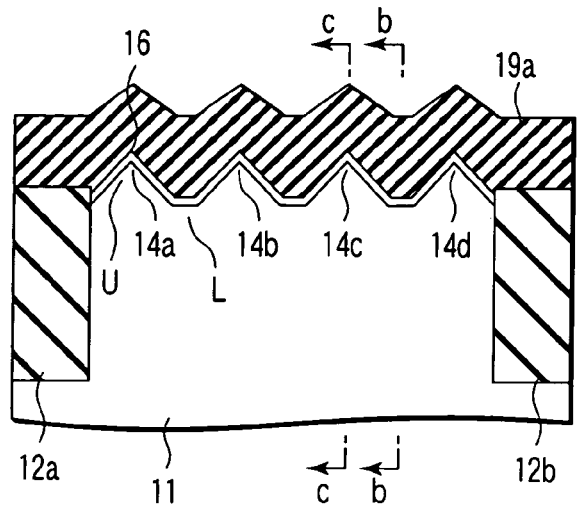
FIGS. 8A to 8C are sectional diagrams of a process subsequent to the manufacturing process of FIGS. 7A to 7D on the silicon wafer.
Figure 8B:
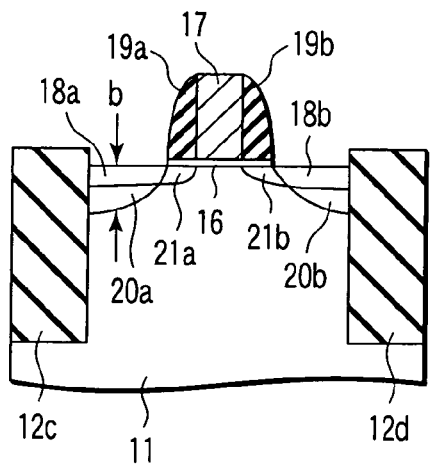
Figure 8C:
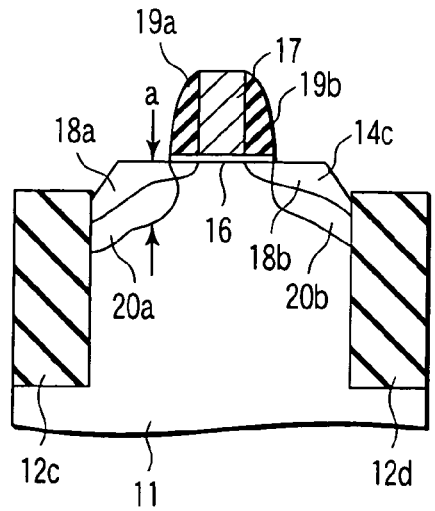

Next, as shown in FIGS. 8A to 8C, gate side wall insulating films 19a, 19b that become spaces for forming LDD diffusion layers (described later) on a side face of the gate electrode 17 are formed on the side wall of the gate electrode 17 by a well-known method. In this state, by using the gate side wall insulating films 19a, 19b as spaces, p-type impurity doped layers 20a, 20b that become source/drain (S/D) diffusion layers are formed deep by impurity implantation. As a result, portions covered with the gate side wall insulating films 19a, 19b in the shallow impurity doped layers 18a, 18b are left as LDD diffusion layers 21a, 21b, and high-concentration S/D diffusion layers 20a, 20b are formed in other portions.

Figure 7D:
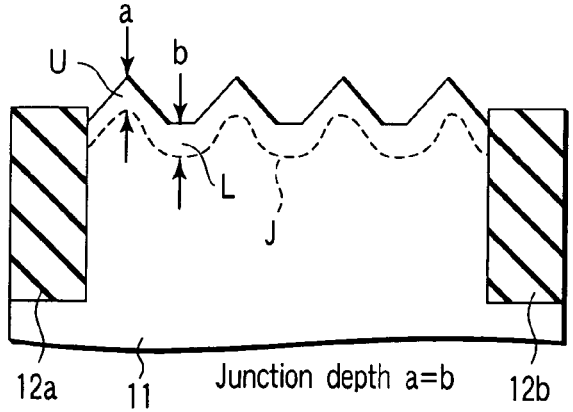

A profile of a junction J in this case becomes as shown in FIG. 7D, in which depths of junctions J below an upper part U of a projected triangular and below a bottom L of the trapezoid are almost equal.

Figure 9A:
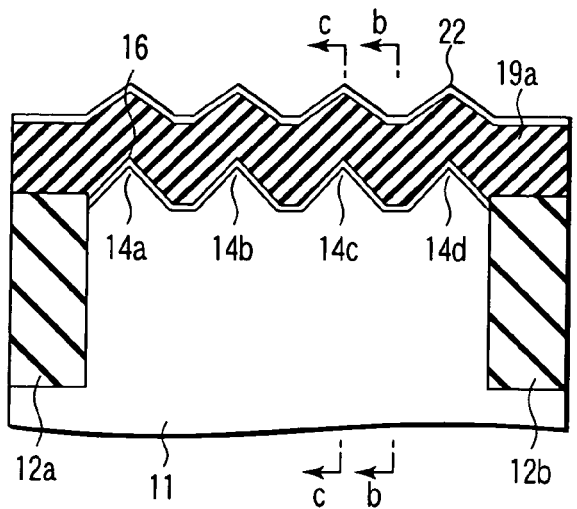
FIGS. 9A to 9C are sectional diagrams of a process subsequent to the manufacturing process of FIGS. 8A to 8C on the silicon wafer.
Figure 9B:
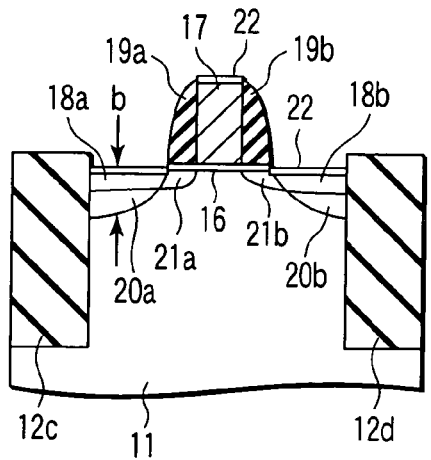
Figure 9C:
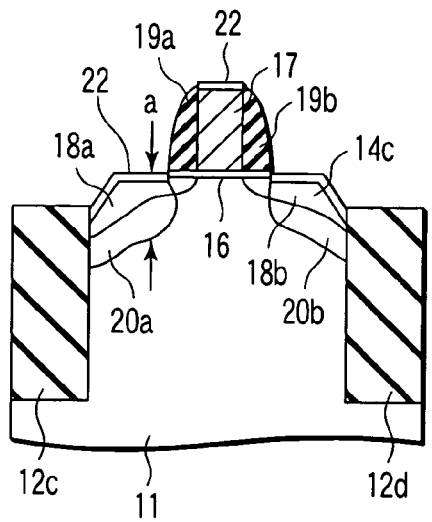

In the state shown in FIGS. 8A to 8C, as shown in FIGS. 9A to 9C, a metal salicide layer 22 is formed on the polysilicon surface of the gate electrode 17 and silicon exposed surfaces of both sides of a gate structure of the projected sections 14a to 14d. For example, the metal salicide layer 22 is formed into a structure shown in FIGS. 9A to 9C by depositing a Co film on a whole surface by sputtering, saliciding the Co film by heat treatment, and then removing an unnecessary metal layer by a predetermined etching solution.

By the aforementioned method, as in the case of the first embodiment, it is possible to manufacture an FET of an optional size in which a sectional shape in the channel width direction of the channel region is saw-tooth. In the FET of the second embodiment thus configured, an electric field by the gate electrode 17 becomes strong at the ridge-shaped top of each of the four triangularly projected sections 14a to 14d arranged in parallel at substantially equal intervals in the channel width direction between the two STI regions 12a, 12b as shown in FIGS. 9A to 9C. Thus, good effects such as S-factor improvement and a back gate effect reduction can be expected from an increase in current density by substantial enlargement of the channel width and enlargement of a depletion layer width by the strong electric field.

However, the thick insulators 13a to 13c used in the first embodiment are not used in the second embodiment. Thus, the bottom portion of the trapezoid-shaped p has characteristics similar to those of a normal planar transistor, and combined with good characteristics of a high current density of a transistor at the top of the triangular section, and an effect of increasing a driving force (current) as a whole can be expected.

Third Embodiment

According to the first and second embodiments, the plurality of silicon projections are formed on the surface of the silicon wafer 11 by the selective epitaxial growth, and the channel of the high current density is formed at each top of the triangular projections. Needless to say, however, the present invention can be similarly implemented even when a plurality of silicon projections are formed on the surface of the silicon wafer 11 by another method. A structure of a third embodiment and its manufacturing method will be described in detail below with reference to FIGS. 10A to 12D.

Figure 10A:
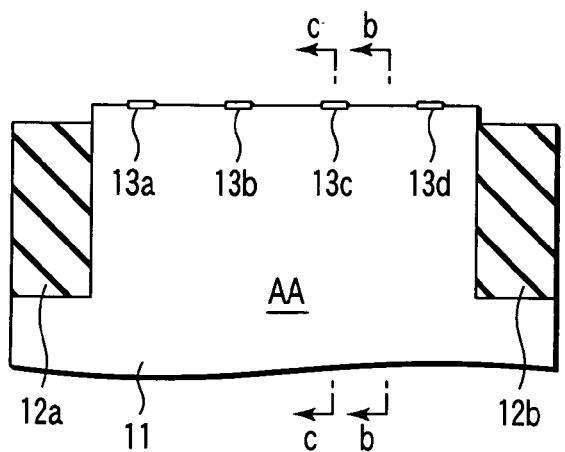
FIGS. 10A to 10C are sectional diagrams of a manufacturing process of an FET on a silicon wafer according to a third embodiment of the present invention.
Figure 10B:
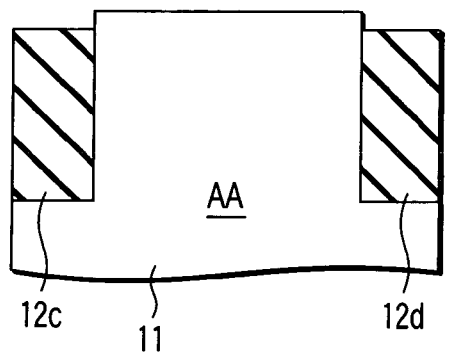
Figure 10C:
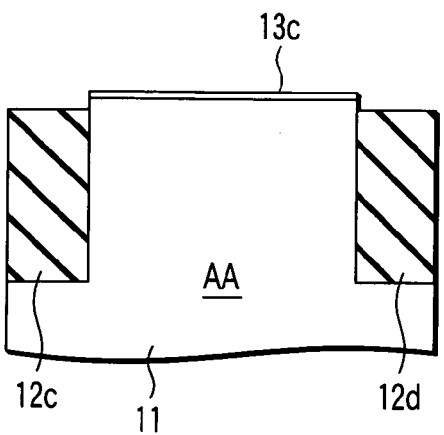

First, referring to FIGS. 10A to 10C, a channel width direction of an active area AA of a silicon wafer 11 is defined by a pair of STI oxide films 12a, 12b formed by a generally known method as shown in FIG. 10A. In this case, as shown in FIGS. 10A to 10C, the STI oxide films 12a, 12b are formed lower by, e.g., about 20 to 30 nm, than a surface of the silicon wafer 11. It is because in a subsequent process, the surface of the silicon wafer 11 is etched to be retreated by a corresponding amount as described later. However, the silicon wafer 11 and the STI oxide films 12a, 12b may be set to equal heights.

In this state, on a surface of the active area AA, an insulating film of a dielectric constant lower as compared with that of a gate insulating film (described later), e.g., a silicon oxide film ($SiO_2$) for forming each of insulators 13a to 13d, is formed by thermally-oxidizing the surface of the silicon wafer 11. This silicon oxide film is formed sufficiently thick as compared with a gate oxide film formed later.

Next, a resist film is deposited on a whole surface of the silicon wafer 11 and, then, desired resist masks are formed by photolithography using photo-masks and etching corresponding to the thick strip-shaped insulators 13a to 13d shown in FIGS. 10A to 10C. In this case, for example, the resist masks formed on the surface of the active area AA are formed in accordance with a line/space ratio (L/S) corresponding to a minimum design rule size F.

Next, to realize a structure shown in each of FIGS. 10A to 10C, as in the case of the process described above with reference to FIGS. 2A to 2C, the exposed oxide film is etched to be removed by using the resist mask as a mask, and then the resist mask 20 is removed. As a result, thick insulators 13a to 13d are formed by silicon oxide films as shown in FIG. 10A.

The thick insulators 13a to 13d can be made of silicon nitride films (SiN) in place of the silicon oxide films. In this case, in place of thermally oxidizing the silicon oxide films 13 in the process of FIGS. 2A to 2C, silicon nitride films are deposited, masks are similarly formed by silicon nitride films by a processing after a resist pattern is formed, thereby forming the thick insulators 13a to 13d by using these.

Figure 11A:
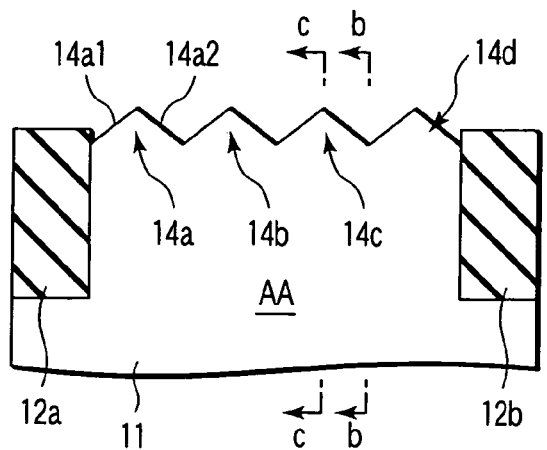
FIGS. 11A to 11C are sectional diagrams of a process subsequent to the manufacturing process of FIGS. 10A to 10C on the silicon wafer.

Subsequently, the silicon exposed surface of the active area AA is subjected to alkaline wet etching. As a result, as is well known, if the surface of the silicon wafer 11 is a (100) facet, silicon surface orientation causes a difference in silicon etching rate, and thus etching surfaces 14a1, 14a2 formed on both sides of, e.g., the insulator 13a become (111) facets by etching as shown in FIG. 11A. As these etching surfaces 14a1, 14a2 become slopes which intersect a normal line of the (100) facet above the insulator 13a and are orthogonal to a channel width direction, a triangularly projected section 14a having ridge portions similar to the projection 14a shown in FIG. 4A is formed on the surface of the silicon wafer 11. For the other insulators 13b to 13d, projected sections 14a to 14d are similarly formed.

Figure 29:
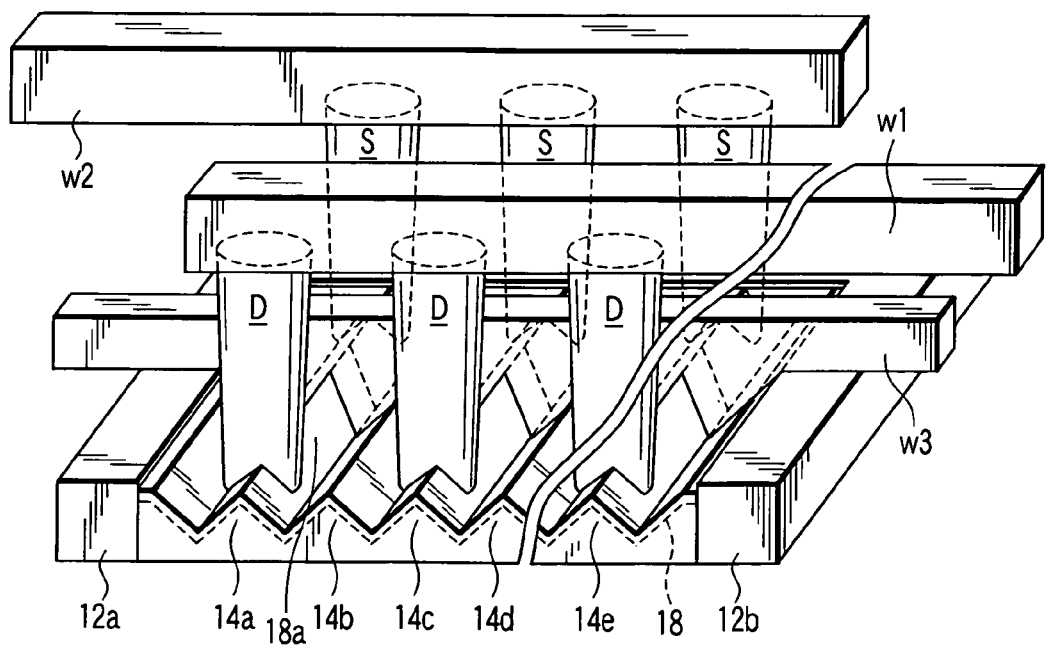
FIG. 29 is a sectional diagram showing a modified example of the embodiment of FIG. 11A.

The (111) facets constituting the slopes 14a1, 14a2 are brought into contact with each other at the end of the etching process. In the similar manner, the projected sections 14a to 14d become triangular shape as shown in FIG. 29, for example.

Figure 11B:
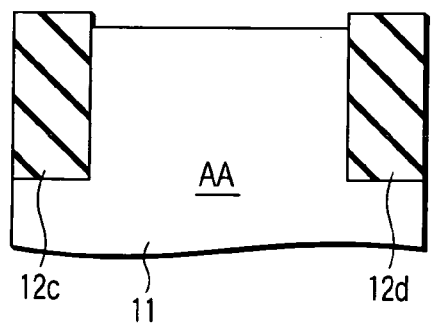
Figure 11C:
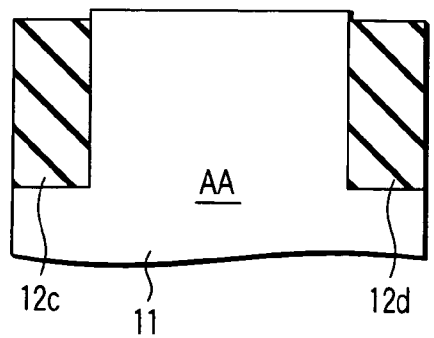

For the projected sections 14a to 14d, a structure is employed in which a plurality of projected sections 14a to 14d of the triangular shape in section are included in the channel width direction, while a single trapezoidal projection is provided in the channel longitudinal direction as shown in FIG. 1C. Accordingly, in the channel width direction, a substantial distance is increased by a part along the triangularly projected sections as compared with its linear distance as in the case of the first and second embodiments. Thus, a structure having the triangularly projected sections 14a to 14d shown in FIGS. 11A to 11C is formed.

Figure 12A:
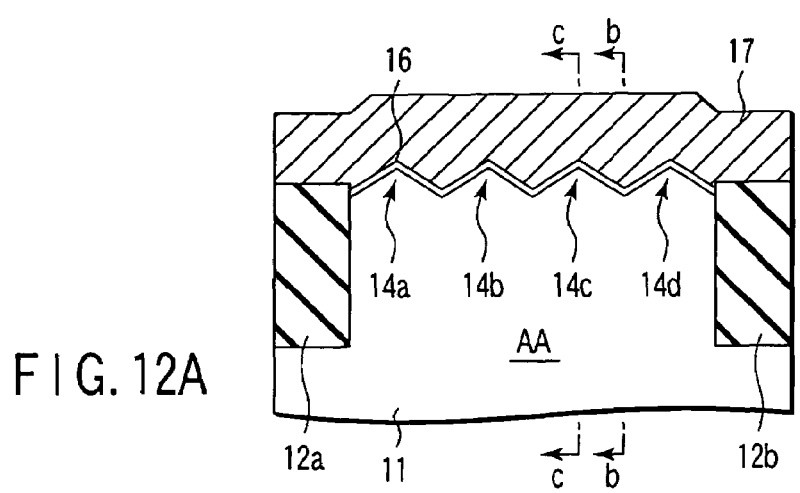
FIGS. 12A to 12D are sectional diagrams of a process subsequent to the manufacturing process of FIGS. 11A to 11C on the silicon wafer.
Figure 12B:
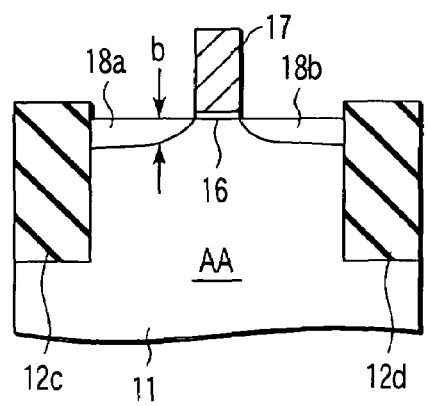
Figure 12C:
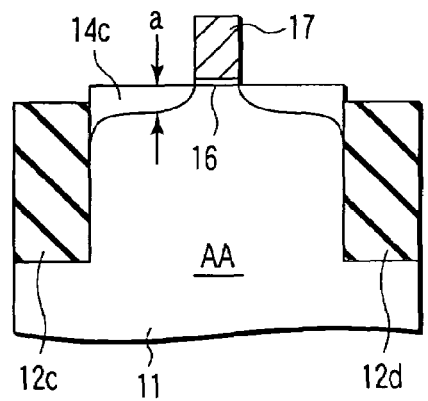
Figure 12D:
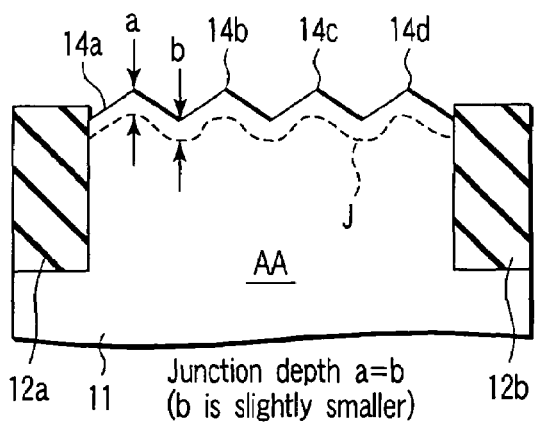

Subsequently, a silicon oxide film 16 is formed on the silicon surfaces of the triangularly projected sections 14a to 14d by thermal oxidation. In this state, as in the case of the first and second embodiments, a gate electrode 17 is formed in an active area AA as shown in FIGS. 12A to 12D, and LDD layers 18a, 18b are formed. In this case, a profile of a junction J by the LDD layer becomes as shown in FIG. 12D, and a junction depth a of the projected section 14a is substantially equal to or slightly larger than a junction depth b at each valley portion formed between the triangularly projected sections.

Additionally, source/drain (S/D) diffusion layers are formed. As in the case of the embodiment shown in FIGS. 8A to 9C, a portion covered with a gate side wall insulating film becomes a LDD diffusion layer, and high-concentration S/D diffusion layers are formed in other portions. Further, as in the case of the embodiment shown in FIGS. 6A to 6C, metal salicide layers may be formed on a polysilicon surface of the gate electrode 17 and silicon exposed surfaces on both sides of a gate structure of the projected sections 14a to 14d.

By the aforementioned method, it is possible to manufacture an FET of an optional size in which a sectional shape in the channel width direction of the channel region is sawtooth. In the FET of the third embodiment thus configured, as in the case of the first and second embodiments, an electric field by the gate electrode 17 becomes strong at the ridge top of each of the four triangularly projected sections 14a to 14d arranged in parallel at substantially equal intervals in the channel width direction between the two STI regions 12a, 12b. Thus, effects such as S-factor improvement and a back gate effect reduction can be expected from an increase in current density and enlargement of a depletion layer width by the strong electric field.

According to the embodiments shown in FIGS. 1A to 1D and FIGS. 7A to 7D, flat sections remain in the valleys formed among the triangularly projected sections 14a to 14d to the end of the manufacturing process corresponding to the thick insulators 13a to 13c used in the course of the manufacturing process. However, according to the embodiment shown in FIGS. 10A to 12D, the valleys formed among the triangularly projected sections 14a to 14d by the wet etching become V-shaped without any flat sections. In this V-shaped valley, an electric field by the gate electrode 17 greatly diverges as compared with the case of the flat valley. Thus, the channel is not turned on in this V-shaped section in most cases, and this section has almost no function of a transistor. Accordingly, the triangularly projected sections 14a to 14d only having normal Id-Vg characteristics become transistors. On the other hand, according to the first and second embodiments, as the channel of the flat section is slightly turned on, this section also functions as a transistor. A threshold value of this transistor is different from that of the transistor of a high current density formed in each of the projected sections 14a to 14d, creating a danger that a bent section (kink section) different from a normal case will be easily formed in Id-Vg characteristics. This kink section causes deterioration of transistor characteristics. From this standpoint, therefore, the third embodiment is better in transistor characteristics than the first and second embodiments.

The top surfaces of the projected sections 14a to 14d are triangular as shown in FIG. 29. Thus, a degree of electric field concentration becomes higher in the top portions of the projected sections, and the current density becomes higher. In FIG. 29, source contacts S and drain contacts D are formed to be connected to the source regions and drain regions formed in both sides of the triangularly projected sections 14a to 14e arranged in the channel width direction, respectively, via a diffusion layer 18. Channel regions are formed between the source and drain regions in the respective projected sections 14a to 14e. The three source regions S are connected in parallel with each other via a wiring w2 and, in the similar manner, the three drain regions D are also connected in parallel via another wiring w1. Gate electrodes between source and drain regions S and D are commonly connected as a gate electrode wiring w3.

As described above, according to the first to third embodiments, the plurality of triangularly projected sections 14a to 14d are formed at substantially equal intervals in the channel width direction of the active area AA formed between the STI oxide films 12a, 12b. However, by changing the intervals of the projected sections formed in two element forming areas in the semiconductor substrate, it is possible to form at least two types of FETs having different in threshold values.

Fourth Embodiment

Figure 13:
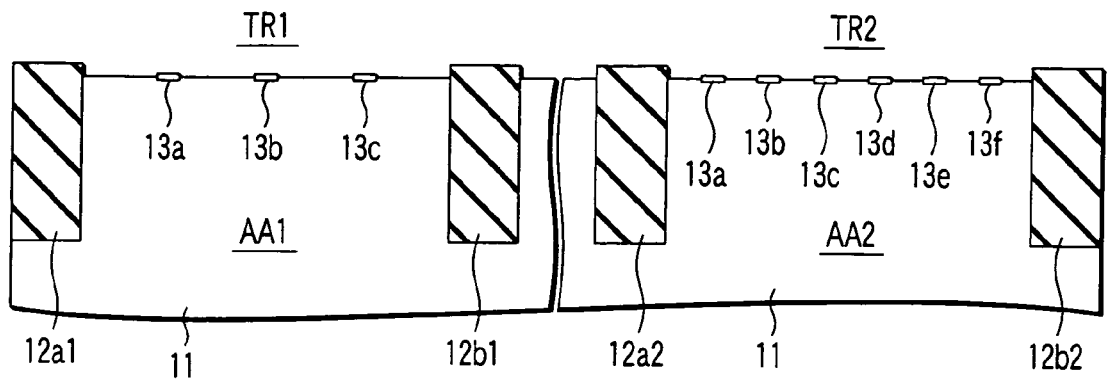
FIG. 13 is a sectional diagram of a manufacturing process of an FET on a silicon wafer according to a fourth embodiment of the present invention.

FIG. 13 is a sectional diagram showing a manufacturing process of an embodiment based on the aforementioned idea. In a first active area AA1 on one chip, three SiO2 masks 13a to 13c are formed between STI oxide films 12a1, 12b1 in a channel width direction. In an area AA2 having a width equal to that of the area AA1, six SiO2 masks 13a to 13f are formed between STI oxide films 12a2, 12b2. Accordingly, pitches of projected sections in which gate lengths and gate widths are equal, i.e., planar shapes are similar, and implantation conditions are similar are changed to change upper part widths, whereby it is possible to form two-group FETs different in threshold value on the same silicon wafer or chip by varying an effective channel width in two areas AA1 and AA2.

After the process of FIG. 13, as in the case of the process of FIG. 4A to 4C, on a surface of the area AA1 of a Si wafer 11, silicon projected sections 14a to 14d are formed among the SiO2 masks 13a to 13c by a SEG method. On a surface of the area AA2, seven silicon projected sections 14a to 14g are formed among the SiO2 masks 13a to 13f.

Figure 14:
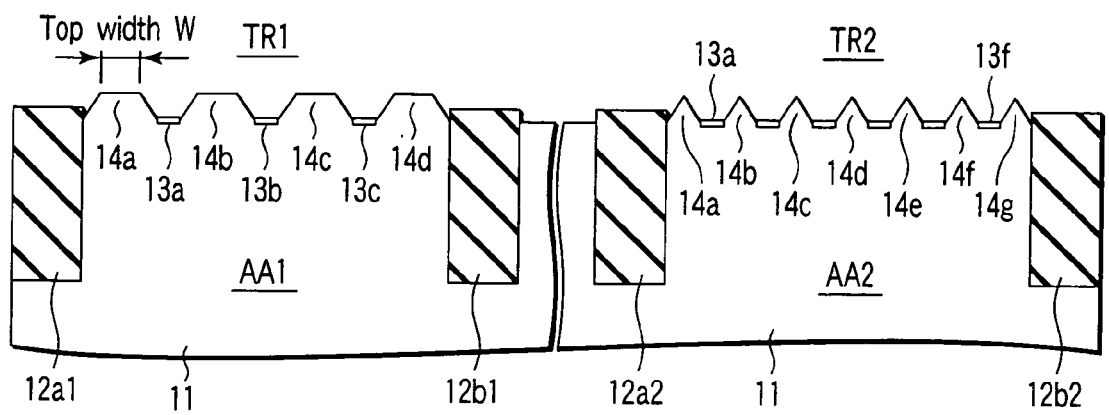
FIG. 14 is a sectional diagram of a process subsequent to the manufacturing process of FIG. 13 on the silicon wafer.

The silicon projected sections 14a to 14d and the silicon projected sections 14a to 14g thus formed are sequentially subjected to an impurity implantation process for forming source/drain regions, a gate electrode forming process, and a salicide forming process as in the case of the embodiment described above with reference to FIGS. 1A to 1D, FIGS. 5A to 5D, and FIGS. 6A to 6C, thereby forming a first transistor TR1 in the area AA1 and a second transistor TR2 in the area AA2. In this case, when silicon projected sections are formed in the two areas AA1, AA2 through the same process by the SEG method, the projected sections 14a to 14g of the area AA2 first become triangular as pitches are narrower. The projected sections 14a to 14d of the area AA1 are still trapezoidal as shown in FIG. 14, and top widths W each has a predetermined value. When impurity implantation is carried out to form a channel in this state, an electric field concentrates in the transistor TR2 as the top of the triangular shape has a ridge like shape, thus increasing electric field intensity than that formed in the area AA1. In other words, since an inversion layer is formed by a small voltage, the transistor TR2 is smaller in threshold value than the transistor TR1. Thus, it is possible to manufacture FETs different in threshold value on the same chip without increasing a channel implantation process. While the projection sections 14a to 14d formed in the area AA1 have trapezoidal shape in the embodiment shown in FIG. 14, it is possible to form the sections 14a to 14d as triangularly projected sections in the similar manner as those formed in the area AA2.

Fifth Embodiment

Figure 15:
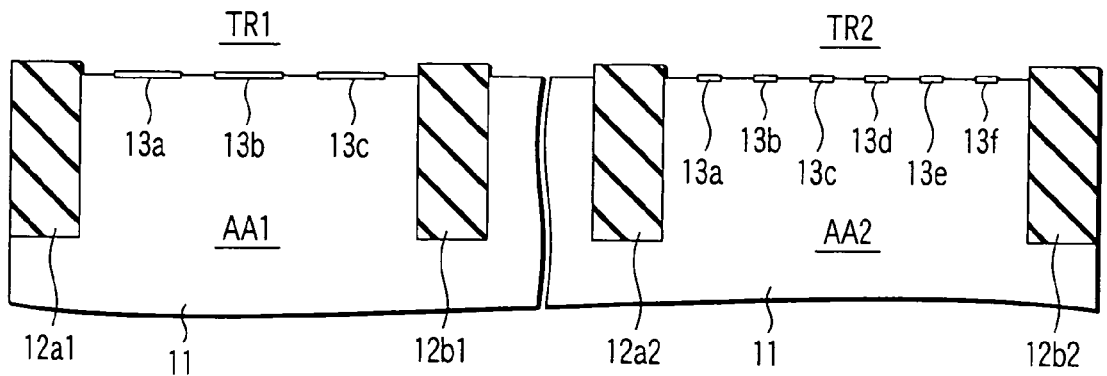
FIG. 15 is a sectional diagram of a manufacturing process of an FET on a silicon wafer according to a fifth embodiment of the present invention.
Figure 16:
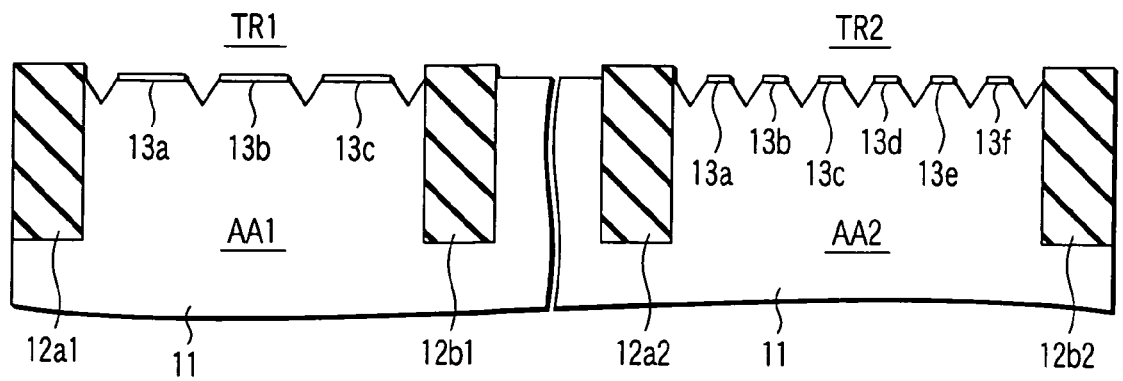
FIG. 16 is a sectional diagram of a process subsequent to the manufacturing process of FIG. 15 on the silicon wafer.
Figure 17:
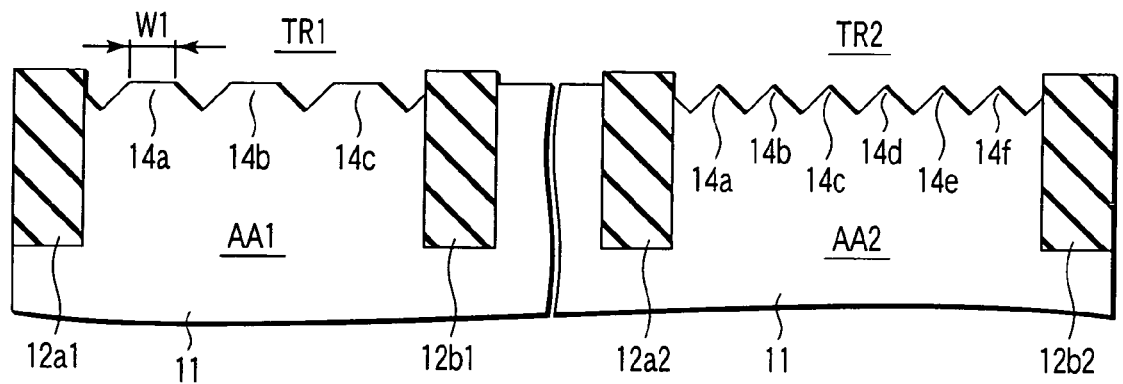
FIG. 17 is a sectional diagram of a process subsequent to the manufacturing process of FIG. 16 on the silicon wafer.

FIGS. 15 to 17 show manufacturing processes according to a fifth embodiment based on the aforementioned idea. First, as shown in FIG. 15, SiO2 masks 13a to 13c are formed at large pitches in an area AA1 of a silicon wafer 11 as in the case of FIG. 13, and SiO2 masks 13a to 13f are formed at narrow pitches in an area AA2. When alkaline wet etching is carried out in this state, surfaces of the silicon wafer 11 exposed among the SiO2 masks 13a to 13c, and 13a to 13f are removed into V shapes by etching as shown in FIG. 16. When the SiO2 masks 13a to 13c, and 13a to 13f are removed by etching in this state, as shown in FIG. 17, three trapezoidal silicon projected sections 14a to 14c large in top width W1 are formed in the area AA1, and six triangular silicon projected sections 14a to 14f having ridge top are formed in the area AA2. According to the embodiment, upper parts of the projected sections 14a to 14f on the transistor TR2 side are triangular. However, as the top shape in the area AA1 has the width W1, the transistor TR2 is much lower in threshold value than the transistor TR1 as compared with the case described above with reference to FIG. 14. A subsequent transistor forming processes are similar to those of the previous embodiments, and thus description thereof will be omitted.

A surface of the silicon wafer 11 of the transistors TR1, TR2 is a (100) facet, a slope constituting a side plane of each projected section is a (111) facet, and hole mobility is high on this (111) facet. Thus, when the transistor TR2 having many triangularly projected sections is a P-channel type, a current density of a channel formed in each of the projected sections 14a to 14f becomes high, realizing a higher-performance transistor. On the other hand, electron mobility is high on the (100) facet. If the transistor TR1 is an N-channel type, a current density is higher when the number of projected sections is smaller. Therefore, the transistor TR1 of the (100) facet alone may be set as an N-channel type as in the case of an embodiment of FIG. 20 (described later). As a result, it is possible to form transistors of both N- and P-channel types having good current characteristics on the same silicon substrate in a chip.

According to the foregoing embodiments, the silicon projected section is formed on the surface of the silicon wafer, and the channel having the high current density is formed thereon. In this portion, however, a threshold voltage is reduced because of electric field concentration at the ridge portions of the triangularly projected sections by the gate electrode. Thus, it is difficult to form a transistor compact and fast but high in threshold voltage with this configuration. Therefore, on the same chip, a transistor to which a high voltage is applied can be formed to be provided with a flat channel region as in the case of the conventional planar type, and a transistor alone required of a high-speed operation can be formed as a transistor having a plurality of channel on the plurality of silicon triangularly projected sections.

Sixth Embodiment

Figure 18:
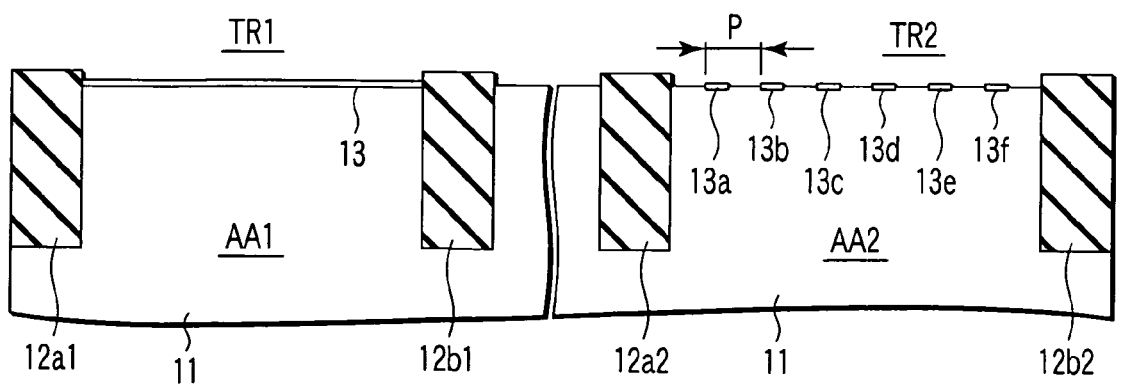
FIG. 18 is a sectional diagram of a manufacturing process of an FET on a silicon wafer according to a sixth embodiment of the present invention.
Figure 19:
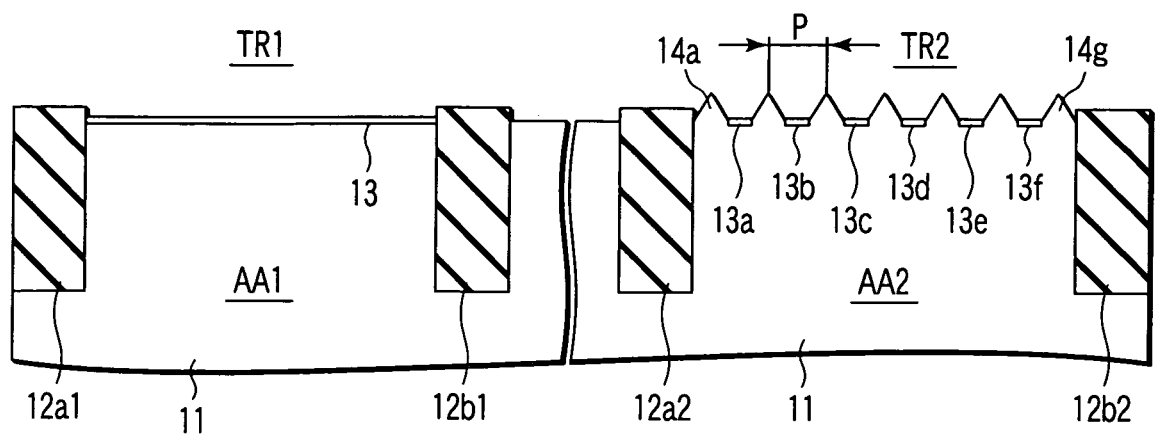
FIG. 19 is a sectional diagram of a process subsequent to the manufacturing process of FIG. 18 on the silicon wafer.
Figure 20:
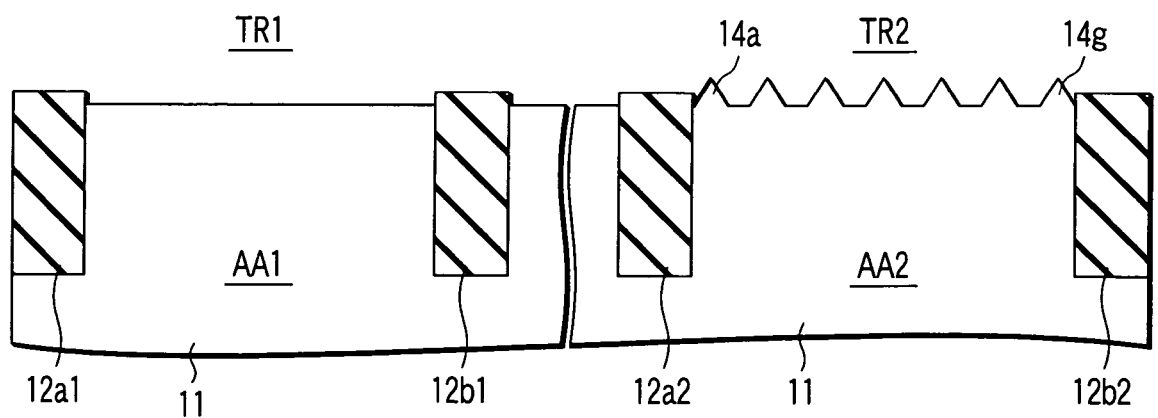
FIG. 20 is a sectional diagram of a process subsequent to the manufacturing process of FIG. 19 on the silicon wafer.

FIGS. 18 to 20 show manufacturing processes of a sixth embodiment based on the aforementioned idea. As shown in FIG. 18, a SiO2 film 13 is formed in an entire area AA1 to form a flat channel-type transistor, and SiO2 masks 13a to 13f are formed in an area AA2 to form a high-speed type transistor having a plurality of triangularly projected sections in a channel region. Then, as shown in FIG. 19, a plurality of silicon projected sections 14a to 14g of triangular shape are formed on surfaces of a silicon wafer 11 among the masks by a SEG method. Next, as shown in FIG. 20, the SiO2 film 13 and the SiO2 masks 13a to 13f are etched to be removed. For example, through the same process as that described above with reference to FIGS. 5A to 6C, a gate electrode is formed, channel impurities are implanted, a salicide layer is formed, and the like, thereby forming a high-breakdown voltage transistor or FET TR1 in the area AA1 and a low-breakdown voltage but high-speed transistor or FET TR2 in the area AA2.

In this case, a minimum size of a pitch P of the SiO2 masks 13a to 13f to manufacture the high-speed circuit transistor TR2 shown in FIG. 18 is designed such that it has a minimum design rule size. Smaller pitches cannot be realized in the design rule. However, this pitch is required to be further reduced to achieve a higher speed of the transistor TR2.

Seventh Embodiment

FIGS. 21 to 28 show an example of manufacturing processes to reduce the pitch. First, as shown in FIG. 21, an area AA2 for forming a transistor TR2 is formed between STI oxide films 12a2, 12b2. Then, as shown in FIG. 22, a sacrificial poly-silicon film 30 is deposited with a thickness of, e.g., 200 nm, on a whole surface of the element forming area or active area of the semiconductor wafer 11, and a resist pattern 31 shown in FIG. 23 is formed thereon at a minimum design rule pitch P by using a lithography method. In this case, before the sacrifice poly-silicon film 30 is formed, an oxide film is formed on a surface of the silicon wafer 11 by thermal oxidation. This oxide film must be formed with a thickness to prevent roughing of the surface of the silicon wafer 11 by etching in preprocessing of an SEG method carried out in the manufacturing process of FIG. 27.

Figure 24:
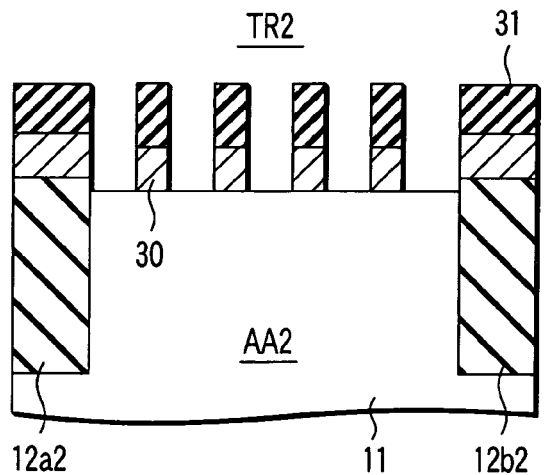
FIG. 24 is a sectional diagram of a process subsequent to the manufacturing process of FIG. 23 on the silicon wafer.
Figure 25:
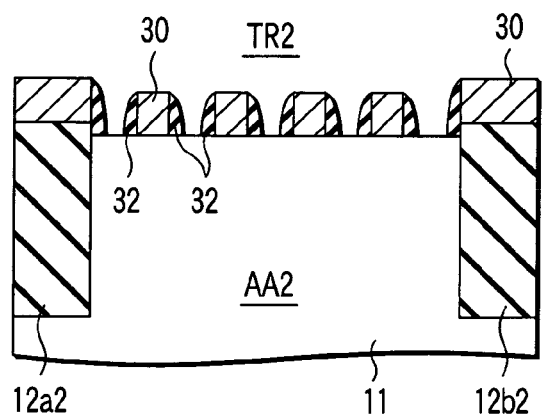
FIG. 25 is a sectional diagram of a process subsequent to the manufacturing process of FIG. 24 on the silicon wafer.

Next, as shown in FIG. 24, the polysilicon film 30 is etched by using the resist mask pattern 31 to form a polysilicon pattern 30. Subsequently, the resist mask pattern 31 is removed, an SIN film is then deposited to bury fully the poly-silicon pattern 30, and the SiN film is etched by using the poly-silicon pattern 30 as a mask, whereby SiN side walls are formed on side faces of the poly-silicon pattern 30 as shown in FIG. 25.

Figure 26:
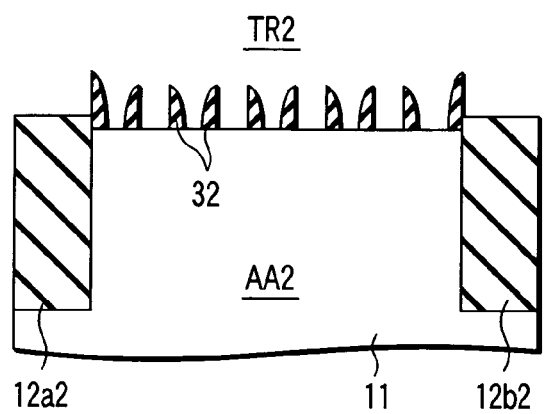
FIG. 26 is a sectional diagram of a process subsequent to the manufacturing process of FIG. 25 on the silicon wafer.
Figure 27:
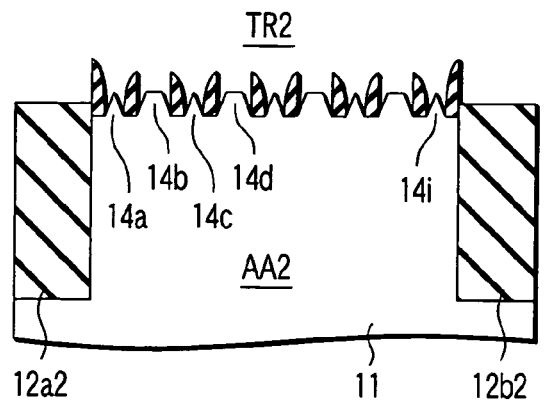
FIG. 27 is a sectional diagram of a process subsequent to the manufacturing process of FIG. 26 on the silicon wafer.

Subsequently, the poly-silicon pattern 30 is removed by selective etching, e.g., by wet etching, and the first formed thermal-oxidized film is removed, whereby a plurality of SiN side walls 32 are left on the surface of the silicon wafer 11 as shown in FIG. 26. Then, as shown in FIG. 27, a plurality of silicon projected sections 14a to 14i are formed on the surface of the silicon wafer 11 exposed among the SiN side walls 32 by the SEG method. Subsequently, when the SiN side walls 32 are removed, two silicon projected sections 14a, 14b are formed for each of a minimum design rule size P as shown in FIG. 28.

Figure 28:
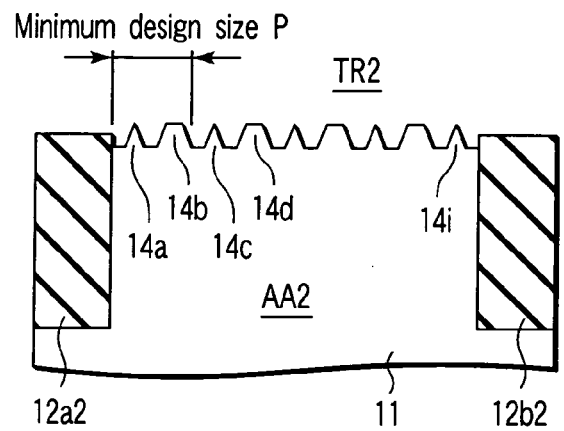
FIG. 28 is a sectional diagram of a process subsequent to the manufacturing process of FIG. 27 on the silicon wafer.

In this case, for example, the second silicon projected section 14b is shown to be wider than the silicon projected section 14a of a left end in FIG. 28. However, by setting the resist patterns 31 formed in the process of FIG. 23 to be equal in width and interval, the SiN spacer side walls 32 formed in FIG. 26 become equal in width and interval. Therefore, lastly formed two adjacent silicon projected sections, e.g., two silicon projected sections 14a, 14b, can be formed in each of the minimum design rule size P to be equal in width. As shown in FIG. 28, the projected sections 14a, 14c . . . 14i are formed as triangularly projected sections, while the projected sections 14b, 14d . . . are formed as trapezoidal projected sections. Further, when the epitaxial growth period for forming these projections 14a to 14i are elongated, all the projected sections may be formed as triangular shaped sections.

Thus, the two silicon projected sections can be formed in each of the minimum design rule size P as described above. Thus, a channel current can be increased more to realize a high-speed transistor.

Needless to say, in place of forming the silicon projected sections by the SEG method according to the embodiment, the surface of the silicon wafer 11 may be etched by alkaline wet etching, for example, to form triangularly projected sections as in the case of the third embodiment.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. The semiconductor device, comprising:
a semiconductor substrate; and
an FET formed on the semiconductor substrate;
wherein the FET comprises;
a source region formed in the semiconductor substrate;
a drain region formed in the semiconductor substrate to face the source region;
a channel region formed on the semiconductor substrate between the source and drain regions, the channel region including a plurality of juxtaposed triangular ridge portions arranged in a width direction of the channel region;
a gate insulating film formed on the triangular ridge portions; and
a gate electrode formed on the gate insulating film,
wherein plurality of projected epitaxial silicon regions are formed as the plurality of triangular ridge portions arranged at substantially equal intervals in the width direction of the channel region, and
wherein an insulating film thicker than the gate insulating film is arranged in each of valley portions formed between the triangular ridge portions.

2. The semiconductor device according to claim 1, wherein the semiconductor substrate is a silicon substrate whose surface has a (100) facet, and each of the triangular ridge portions of the projected epitaxial silicon regions are defined by two opposing slopes of (111) facets to form the triangular ridge portion between the slopes of (111) facets.

3. A semiconductor device comprising:
a semiconductor substrate;
a first FET formed on a first active area of the semiconductor substrate; and
a second FET formed on a second active area of the semiconductor substrate;
wherein the first FET comprises:
a first source region formed in the semiconductor substrate;
a first drain region formed in the semiconductor substrate to face the first source region;
a first channel region formed on the semiconductor substrate between the first source and drain regions, the first channel region including a plurality of first projected epitaxial silicon regions to form juxtaposed triangular ridge portions arranged in a width direction of the first channel region;
a first gate insulating film formed on the triangular ridge portions; and
a first gate electrode formed on the first gate insulating film; and
the second FET comprises:
a second source region formed in the semiconductor substrate;
a second drain region formed in the semiconductor substrate to face the second source region;
a second channel region formed on the semiconductor substrate between the second source and drain regions, the second channel region including a plurality of second projected epitaxial silicon regions to form juxtaposed trapezoid ridge portions arranged in the width direction of the second channel region;
a second gate insulating film formed on the trapezoid ridge portions; and
a second gate electrode formed on the second gate insulating film.

4. The semiconductor device according to claim 3, wherein an insulating film thicker than the second gate insulating film is arranged in each of valley portions formed between the trapezoid ridge portions in the second channel region of the second FET.

5. The semiconductor device according to claim 3, wherein the semiconductor substrate is a silicon substrate whose surface has a (100) facet, and each of the trapezoid ridge portions of the projected second epitaxial silicon regions in the second channel region are defined by two opposing slopes of (111) facets to form the trapezoid ridge portion between the slopes of (111) facets.

6. The semiconductor device according to claim 3, wherein the plurality of second projected silicon regions are arranged at substantially equal intervals in the width direction of the second channel region.

7. The semiconductor device according to claim 3, wherein the first and second channel regions include first and second impurity implantation regions, respectively, and the first and second impurity implantation regions have substantially the same impurity concentration, so that the first FET has a threshold value different from that of the second FET.

8. A semiconductor device comprising:
a semiconductor substrate;
a first FET formed on a first active area of the semiconductor substrate; and
a second FET formed on a second active area of the semiconductor substrate;
wherein the first FET comprises:
a first source region formed in the semiconductor substrate;
a first drain region formed in the semiconductor substrate to face the first source region;
a first channel region formed on the semiconductor substrate between the first source and drain regions, the first channel region including a plurality of first projected epitaxial silicon regions arranged in a width direction of the first channel region;
a first gate insulating film formed on the first channel region; and
a first gate electrode formed on the first gate insulating film; and
the second FET comprises:
a second source region formed in the semiconductor substrate;
a second drain region formed in the semiconductor substrate to face the second source region;
a second channel region formed on the semiconductor substrate between the second source and drain regions, the second channel region including a plurality of second projected epitaxial silicon regions arranged in a width direction of the second channel region;
a second gate insulating film formed on the second channel region; and
a second gate electrode formed on the second gate insulating film,
wherein the first projected epitaxial silicon regions of the first channel region have a pitch smaller than that of the second projected epitaxial silicon regions of the second channel region.

* * * * *